United States Patent
Vergis et al.

(10) Patent No.: US 10,789,010 B2
(45) Date of Patent: Sep. 29, 2020

(54) DOUBLE DATA RATE COMMAND BUS

(71) Applicant: Intel Corporation, Santa Clara, CA (US)

(72) Inventors: George Vergis, Portland, OR (US); Kuljit S. Bains, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/282,757

(22) Filed: Sep. 30, 2016

(65) Prior Publication Data

US 2018/0061478 A1 Mar. 1, 2018

Related U.S. Application Data

(60) Provisional application No. 62/380,360, filed on Aug. 26, 2016.

(51) Int. Cl.
| | |
|---|---|
| G06F 3/06 | (2006.01) |
| G11C 7/10 | (2006.01) |
| G06F 13/16 | (2006.01) |
| G11C 11/4076 | (2006.01) |
| G11C 11/4093 | (2006.01) |

(52) U.S. Cl.
CPC ............ *G06F 3/0659* (2013.01); *G06F 3/061* (2013.01); *G06F 3/0656* (2013.01); *G06F 3/0683* (2013.01); *G06F 13/16* (2013.01); *G06F 13/1678* (2013.01); *G06F 13/1684* (2013.01); *G11C 7/1045* (2013.01); *G11C 7/1072* (2013.01); *G11C 11/4076* (2013.01); *G11C 11/4093* (2013.01)

(58) Field of Classification Search
None
See application file for complete search history.

(56) References Cited

U.S. PATENT DOCUMENTS

| | | | | |
|---|---|---|---|---|
| 6,950,350 B1 * | 9/2005 | Kerl | ...................... | G11C 7/1006 365/189.05 |
| 6,996,749 B1 * | 2/2006 | Bains | ...................... | G11C 29/48 714/42 |

(Continued)

FOREIGN PATENT DOCUMENTS

WO 2010000554 A1 1/2010

OTHER PUBLICATIONS

National Instruments, Generating Double Data Rate Waveforms with NI Digital Waveform Generator/Analyzers, Jan. 26, 2015 (Year: 2015).*

(Continued)

*Primary Examiner* — Charles J Choi
(74) *Attorney, Agent, or Firm* — Compass IP Law PC

(57) ABSTRACT

A memory subsystem includes a command address bus capable to be operated at double data rate. A memory circuit includes N command signal lines that operate at a data rate of 2R to receive command information from a memory controller. The memory circuit includes 2N command signal lines that operate at a data rate of R to transfer the commands to one or more memory devices. While ratios of 1:2 are specified, similar techniques can be used to send command signals at higher data rates over fewer signal lines from a host to a logic circuit, which then transfers the command signals at lower data rates over more signal lines.

22 Claims, 9 Drawing Sheets

(56) References Cited

U.S. PATENT DOCUMENTS

| | | | |
|---|---|---|---|
| 7,921,243 B1 | 4/2011 | White | |
| 9,715,936 B2 | 7/2017 | Lee et al. | |
| 9,768,783 B1 | 9/2017 | Schmit et al. | |
| 10,241,727 B1* | 3/2019 | Shallal | G06F 3/0685 |
| 2006/0095701 A1 | 5/2006 | Gower et al. | |
| 2008/0040529 A1* | 2/2008 | Bartley | G06F 13/4243 |
| | | | 710/307 |
| 2008/0155187 A1 | 6/2008 | Skerlj | |
| 2009/0323879 A1* | 12/2009 | Caltagirone | G06F 13/4291 |
| | | | 375/371 |
| 2010/0005214 A1 | 1/2010 | Trombley et al. | |
| 2011/0055617 A1* | 3/2011 | Sankuratri | G06F 13/1684 |
| | | | 713/600 |
| 2011/0302366 A1* | 12/2011 | Peterson | G06F 12/0623 |
| | | | 711/105 |
| 2013/0058175 A1* | 3/2013 | Lin | G11C 7/1045 |
| | | | 365/193 |
| 2013/0111122 A1* | 5/2013 | Song | G06F 13/1647 |
| | | | 711/105 |
| 2017/0160935 A1 | 6/2017 | Gillingham et al. | |
| 2017/0169877 A1 | 6/2017 | Zerbe et al. | |
| 2017/0287538 A1 | 10/2017 | Gonzalez | |

OTHER PUBLICATIONS

International Search Report and Written Opinion for PCT Patent Application No. PCT/US2017/045046, dated Nov. 15, 2017, 14 pages.

\* cited by examiner

DOUBLE DATA RATE COMMAND BUS

RELATED APPLICATION

This application is a nonprovisional application based on U.S. Provisional Application No. 62/380,360, filed Aug. 26, 2016, and claims the benefit of priority of that application. The provisional is hereby incorporated by reference.

FIELD

The descriptions are generally related to memory devices, and more particular descriptions are related to a double data rate command bus interface.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2016, Intel Corporation, All Rights Reserved.

BACKGROUND

As processors continue to increase in performance and throughput, the exchange of data from the memory devices to the processor can create a bottleneck in electronics and computing devices. To increase throughput, wider interfaces have been used to increase the number of signal lines used to exchange signals between the memory and the processors. However, more signal lines means more pins on connectors, resulting in larger packages, and more power consumption.

In the case of memory subsystems with memory modules such as dual inline memory modules (DIMMs), wider memory interfaces become difficult to implement physically. DIMMs typically have constrained DIMM connector pin counts, and the use of wider interfaces traditionally requires tradeoffs between how the pin count of the interface will be used. Some DIMMs include a register or other logic device to buffer the incoming command and address signals from the host, which can reduce loading on the host. However, not only do wider interfaces require pin usage tradeoffs for the DIMM connector, but can result in a larger register package, which tends to increase costs. Additionally, wider buses require more logic (e.g., more XOR (exclusive OR) stages) to compute parity for the signals, which can result in higher throughput delays compared to a narrower bus.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Figure 1:
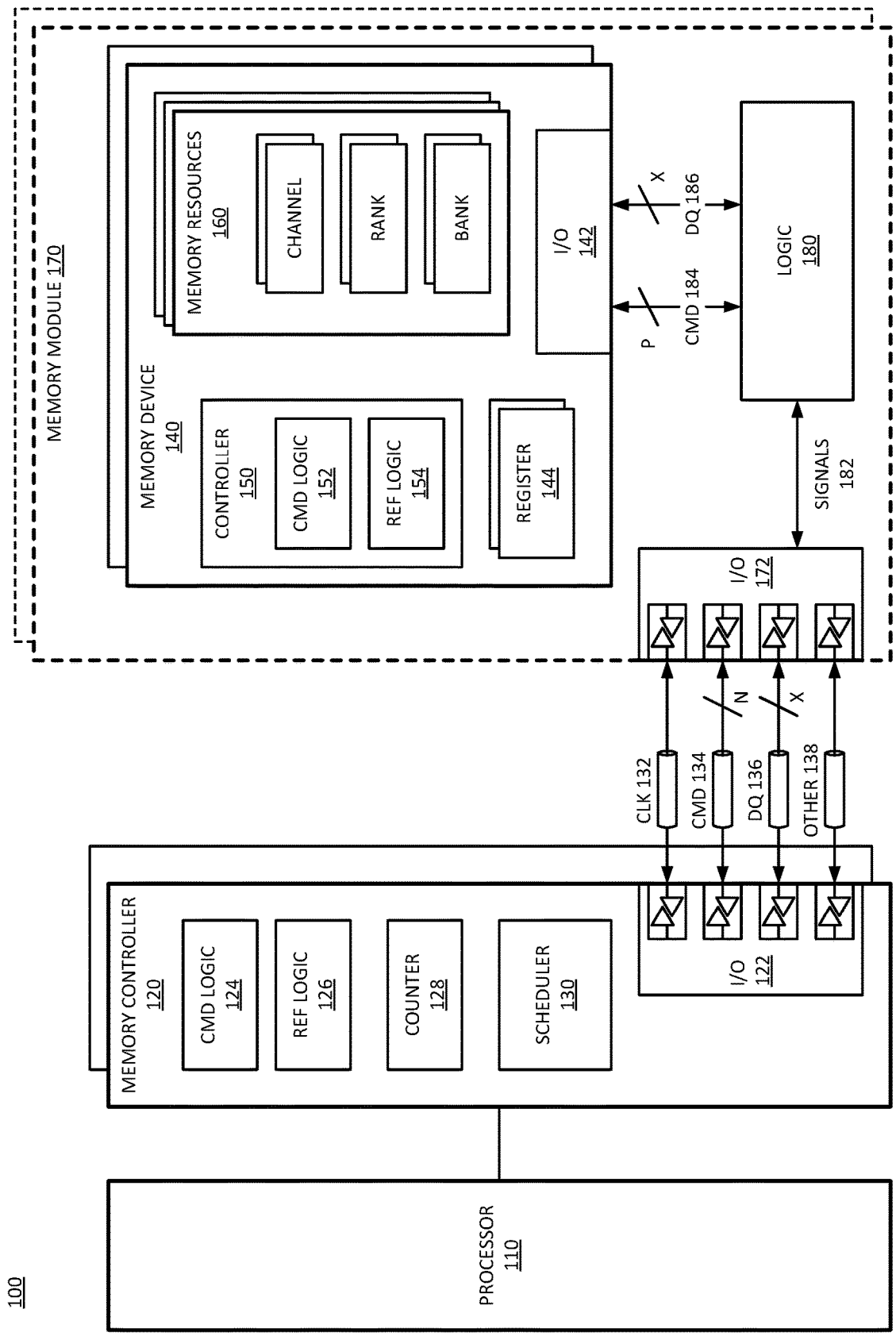
FIG. 1 is a block diagram of an embodiment of a system with a memory device coupled to a double data rate command bus.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, a memory subsystem includes a command address bus that has a bus width mismatch with the memory devices. The command bus from the host is narrower and operates at a higher data rate than the native command bus interface of the memory devices. The memory subsystem includes logic to receive the higher data rate command signals and forward them to the memory devices at the lower or standard data rate. The logic can thus be an interface for a command bus with a lower number of signal lines and a higher data rate to a command bus with a higher number of signal lines and a lower data rate.

In one embodiment, the command bus from the host is capable to be operated at double data rate. In such an embodiment, a memory circuit includes N command signal lines that operate at a data rate of 2R to receive command information from a memory controller. The memory circuit includes 2N command signal lines that operate at a data rate of R to transfer the commands to one or more memory devices. While ratios of 1:2 are specified, similar techniques can be used to send command signals at higher data rates over fewer signal lines from a host to a logic circuit, which then transfers the command signals at lower data rates over more signal lines. With ratios of 1:2, embodiments can be implemented for a double data rate command bus.

With the use of two different command buses, or two different stages of command bus, namely one that has a higher data rate and lower signal count, and one that has a lower data rate and higher signal count, the bus width from the host can be reduced without impacting the bandwidth of the command bus. In one embodiment, the two different buses or different bus portions are a double data rate (DDR) portion between the host (e.g., the processor or memory controller) and control logic, and a single data rate (SDR) portion between the control logic and the memory devices. DDR refers to transmission of data on both edges of the clock signal (e.g., both a rising edge and a falling edge trigger a data bit), whereas SDR refers to transmission of data on every other clock edge or on a consistent edge (e.g., either the rising or falling edge, but not both). With a narrow bus interface, the control logic can be implemented in a smaller physical package. Additionally, parity computation logic can be simplified since there are fewer signal lines. Parity is typically computed by XORing different signal lines together in stages (or cascaded); thus, fewer signal lines results in fewer XOR stages and a lower parity computation delay.

In one embodiment, the control logic, such as a register of a memory module, can include a mode run the host-facing command and address (C/A or CMD/ADD or simply CMD) bus at a higher rate (e.g., DDR), and run the memory-facing CMD bus at a lower rate (e.g., SDR). In such an embodiment, legacy memory devices can be used, since there will be no change to the command bus interface for the memory devices. Thus, the memory devices can still run the command bus interface at a lower data rate or standard data rate (e.g., SDR), while enabling a higher data rate for the command bus from the host.

In one embodiment, the system includes parity checking. In one embodiment, the control logic computes parity of the received signals. In one embodiment, the memory controller sends the parity signal at the same data rate as the bus which the parity signal represents. Thus, a parity signal for a DDR bus, for example, would be sent at DDR, and a parity signal for an SDR bus would be sent at SDR.

FIG. 1 is a block diagram of an embodiment of a system with a memory device coupled to a double data rate command bus. System 100 includes a processor and elements of a memory subsystem in a computing device. Processor 110 represents a processing unit of a computing platform that may execute an operating system (OS) and applications, which can collectively be referred to as the host or user of the memory. The OS and applications execute operations that result in memory accesses. Processor 110 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processor via a bus (e.g., PCI express), or a combination. System 100 can be implemented as an SOC (system on a chip), or be implemented with standalone components.

Reference to memory devices can apply to different memory types. Memory devices often refers to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (double data rate version 3, original release by JEDEC (Joint Electronic Device Engineering Council) on Jun. 27, 2007, currently on release 21), DDR4 (DDR version 4, initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (currently in discussion by JEDEC), HBM2 (HBM version 2), currently in discussion by JEDEC), or others or combinations of memory technologies, and technologies based on derivatives or extensions of such specifications.

In addition to, or alternatively to, volatile memory, in one embodiment, reference to memory devices can refer to a nonvolatile memory device whose state is determinate even if power is interrupted to the device. In one embodiment, the nonvolatile memory device is a block addressable memory device, such as NAND or NOR technologies. Thus, a memory device can also include a future generation nonvolatile devices, such as a three dimensional crosspoint (3DXP) memory device, other byte addressable nonvolatile memory devices, or memory devices that use chalcogenide phase change material (e.g., chalcogenide glass). In one embodiment, the memory device can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Descriptions herein referring to a "RAM" or "RAM device" can apply to any memory device that allows random access, whether volatile or nonvolatile. Descriptions referring to a "DRAM" or a "DRAM device" can refer to a volatile random access memory device. The memory device or DRAM can refer to the die itself, to a packaged memory product that includes one or more dies, or both. In one embodiment, a system with volatile memory that needs to be refreshed can also include nonvolatile memory.

Memory controller 120 represents one or more memory controller circuits or devices for system 100. Memory controller 120 represents control logic that generates memory access commands in response to the execution of operations by processor 110. Memory controller 120 accesses one or more memory devices 140. Memory devices 140 can be DRAM devices in accordance with any referred to above. In one embodiment, memory devices 140 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. As used herein, coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one embodiment, settings for each channel are controlled by separate mode registers or other register settings. In one embodiment, each memory controller 120 manages a separate memory channel, although system 100 can be configured to have multiple channels managed by a single controller, or to have multiple controllers on a single channel. In one embodiment, memory controller 120 is part of host processor 110, such as logic implemented on the same die or implemented in the same package space as the processor.

Memory controller 120 includes I/O interface logic 122 to couple to a memory bus, such as a memory channel as referred to above. I/O interface logic 122 (as well as I/O interface logic 142 of memory device 140) can include pins, pads, connectors, signal lines, traces, or wires, or other hardware to connect the devices, or a combination of these. I/O interface logic 122 can include a hardware interface. As illustrated, I/O interface logic 122 includes at least drivers/transceivers for signal lines. Commonly, wires within an integrated circuit interface couple with a pad, pin, or connector to interface signal lines or traces or other wires between devices. I/O interface logic 122 can include drivers, receivers, transceivers, or termination, or other circuitry or combinations of circuitry to exchange signals on the signal lines between the devices. The exchange of signals includes at least one of transmit or receive. While shown as coupling I/O 122 from memory controller 120 to I/O 142 of memory device 140, it will be understood that in an implementation of system 100 where groups of memory devices 140 are accessed in parallel, multiple memory devices can include I/O interfaces to the same interface of memory controller 120. In an implementation of system 100 including one or more memory modules 170, I/O 142 can include interface hardware of the memory module in addition to interface hardware on the memory device itself. Other memory controllers 120 will include separate interfaces to other memory devices 140.

The bus between memory controller 120 and memory devices 140 can be implemented as multiple signal lines coupling memory controller 120 to memory devices 140. The bus may typically include at least clock (CLK) 132, command/address (CMD) 134, and write data (DQ) and read DQ 136, and zero or more other signal lines 138. In one embodiment, a bus or connection between memory controller 120 and memory can be referred to as a memory bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one embodiment, independent channels have different clock signals, C/A buses, data buses, and other signal lines. Thus, system 100 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 120 and memory devices 140. An example of a serial bus technology is 8B10B encoding and transmission of high-speed data with embedded clock over a single differential pair of signals in each direction.

In one embodiment, one or more of CLK 132, CMD 134, DQ 136, or other 138 can be routed to memory devices 140 through logic 180. Logic 180 can be or include a register or buffer circuit. Logic 180 can reduce the loading on the interface to I/O 122, which allows faster signaling or reduced errors or both. The reduced loading can be because I/O 122 sees only the termination of one or more signals at logic 180, instead of termination of the signal lines at every one or memory devices 140 in parallel. While I/O interface 142 is not specifically illustrated to include drivers or transceivers, it will be understood that I/O interface 142 includes hardware necessary to couple to the signal lines. Additionally, for purposes of simplicity in illustrations, I/O interface 142 does not illustrate all signals corresponding to what is shown with respect to I/O interface 122. In one embodiment, all signals of I/O interface 122 have counterparts at I/O interface 142. Some or all of the signal lines interfacing I/O interface 142 can be provided from logic 180. In one embodiment, certain signals from I/O interface 122 do not directly couple to I/O interface 142, but couple through logic 180, while one or more other signals may directly couple to I/O interface 142 from I/O interface 122 via I/O interface 172, but without be buffered through logic 180. Signals 182 represent the signals that interface with memory devices 140 through logic 180.

It will be understood that in the example of system 100, the bus between memory controller 120 and memory devices 140 includes a subsidiary command bus CMD 134 and a subsidiary bus to carry the write and read data, DQ 136. In one embodiment, the data bus can include bidirectional lines for read data and for write/command data. In another embodiment, the subsidiary bus DQ 136 can include unidirectional write signal lines for write and data from the host to memory, and can include unidirectional lines for read data from the memory to the host. In accordance with the chosen memory technology and system design, other signals 138 may accompany a bus or sub bus, such as strobe lines DQS. Based on design of system 100, or implementation if a design supports multiple implementations, the data bus can have more or less bandwidth per memory device 140. For example, the data bus can support memory devices that have either a ×32 interface, a ×16 interface, a ×8 interface, or other interface. The convention "xW," where W is an integer that refers to an interface size or width of the interface of memory device 140, which represents a number of signal lines to exchange data with memory controller 120. The number is often binary, but is not so limited. The interface size of the memory devices is a controlling factor on how many memory devices can be used concurrently per channel in system 100 or coupled in parallel to the same signal lines. In one embodiment, high bandwidth memory devices, wide interface devices, or stacked memory configurations, or combinations, can enable wider interfaces, such as a ×128 interface, a ×256 interface, a ×512 interface, a ×1024 interface, or other data bus interface width.

Memory devices 140 represent memory resources for system 100. In one embodiment, each memory device 140 is a separate memory die. In one embodiment, each memory device 140 can interface with multiple (e.g., 2) channels per device or die. Each memory device 140 includes I/O interface logic 142, which has a bandwidth determined by the implementation of the device (e.g., ×16 or ×8 or some other interface bandwidth). I/O interface logic 142 enables the memory devices to interface with memory controller 120. I/O interface logic 142 can include a hardware interface, and can be in accordance with I/O 122 of memory controller, but at the memory device end. In one embodiment, multiple memory devices 140 are connected in parallel to the same command and data buses. In another embodiment, multiple memory devices 140 are connected in parallel to the same command bus, and are connected to different data buses. For example, system 100 can be configured with multiple memory devices 140 coupled in parallel, with each memory device responding to a command, and accessing memory resources 160 internal to each. For a Write operation, an individual memory device 140 can write a portion of the overall data word, and for a Read operation, an individual memory device 140 can fetch a portion of the overall data word. As non-limiting examples, a specific memory device can provide or receive, respectively, 8 bits of a 128-bit data word for a Read or Write transaction, or 8 bits or 16 bits (depending for a ×8 or a ×16 device) of a 256-bit data word. The remaining bits of the word will be provided or received by other memory devices in parallel.

In one embodiment, memory devices 140 are disposed directly on a motherboard or host system platform (e.g., a PCB (printed circuit board) on which processor 110 is disposed) of a computing device. In one embodiment, memory devices 140 can be organized into memory modules 170. In one embodiment, memory modules 170 represent dual inline memory modules (DIMMs). In one embodiment, memory modules 170 represent other organization of multiple memory devices to share at least a portion of access or control circuitry, which can be a separate circuit, a separate device, or a separate board from the host system platform. Memory modules 170 can include multiple memory devices 140, and the memory modules can include support for multiple separate channels to the included memory devices disposed on them. In another embodiment, memory devices 140 may be incorporated into the same package as memory controller 120, such as by techniques such as multi-chip-module (MCM), package-on-package, through-silicon VIA (TSV), or other techniques or combinations. Similarly, in one embodiment, multiple memory devices 140 may be incorporated into memory modules 170, which themselves may be incorporated into the same package as memory controller 120. It will be appreciated that for these and other embodiments, memory controller 120 may be part of host processor 110.

Memory devices 140 each include memory resources 160. Memory resources 160 represent individual arrays of memory locations or storage locations for data. Typically memory resources 160 are managed as rows of data, accessed via wordline (rows) and bitline (individual bits within a row) control. Memory resources 160 can be organized as separate channels, ranks, and banks of memory. Channels may refer to independent control paths to storage locations within memory devices 140. Ranks may refer to common locations across multiple memory devices (e.g., same row addresses within different devices). Banks may refer to arrays of memory locations within a memory device 140. In one embodiment, banks of memory are divided into sub-banks with at least a portion of shared circuitry (e.g., drivers, signal lines, control logic) for the sub-banks. It will be understood that channels, ranks, banks, sub-banks, bank groups, or other organizations of the memory locations, and combinations of the organizations, can overlap in their application to physical resources. For example, the same physical memory locations can be accessed over a specific channel as a specific bank, which can also belong to a rank. Thus, the organization of memory resources will be understood in an inclusive, rather than exclusive, manner.

In one embodiment, memory devices 140 include one or more registers 144. Register 144 represents one or more storage devices or storage locations that provide configuration or settings for the operation of the memory device. In one embodiment, register 144 can provide a storage location for memory device 140 to store data for access by memory controller 120 as part of a control or management operation. In one embodiment, register 144 includes one or more Mode Registers. In one embodiment, register 144 includes one or more multipurpose registers. The configuration of locations within register 144 can configure memory device 140 to operate in different "mode," where command information can trigger different operations within memory device 140 based on the mode. Additionally or in the alternative, different modes can also trigger different operation from address information or other signal lines depending on the mode. Settings of register 144 can indicate configuration for I/O settings (e.g., timing, termination or ODT (on-die termination), driver configuration, or other I/O settings).

In one embodiment, memory device 140 includes ODT as part of the interface hardware associated with I/O interface 142. In one embodiment, I/O interface 172 is included in logic 180. In one embodiment, either or both of I/O interface 172 and logic 180 can include ODT circuitry. In general, ODT can provide settings for impedance to be applied to the interface to specified signal lines. In one embodiment, ODT is applied to DQ signal lines. In one embodiment, ODT is applied to command signal lines. In one embodiment, ODT is applied to address signal lines. In one embodiment, ODT can be applied to any combination of the preceding. The ODT settings can be changed based on whether a memory device is a selected target of an access operation or a non-target device. ODT settings can affect the timing and reflections of signaling on the terminated lines. Careful control over ODT can enable higher-speed operation with improved matching of applied impedance and loading. ODT can be applied to specific signal lines of the I/O interfaces, and is not necessarily applied to all signal lines.

Memory device 140 includes controller 150, which represents control logic within the memory device to control internal operations within the memory device. For example, controller 150 decodes commands sent by memory controller 120 and generates internal operations to execute or satisfy the commands. Controller 150 can be referred to as an internal controller, and is separate from memory controller 120 of the host. Controller 150 can determine what mode is selected based on register 144, and configure the internal execution of operations for access to memory resources 160 or other operations based on the selected mode. Controller 150 generates control signals to control the routing of bits within memory device 140 to provide a proper interface for the selected mode and direct a command to the proper memory locations or addresses.

Referring again to memory controller 120, memory controller 120 includes scheduler 130, which represents logic or circuitry to generate and order transactions to send to memory device 140. From one perspective, the primary function of memory controller 120 could be said to schedule memory access and other transactions to memory device 140. Such scheduling can include generating the transactions themselves to implement the requests for data by processor 110 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 120 typically includes logic to allow selection and ordering of transactions to improve performance of system 100. Thus, memory controller 120 can select which of the outstanding transactions should be sent to memory device 140 in which order, which is typically achieved with logic much more complex that a simple first-in first-out algorithm. Memory controller 120 manages the transmission of the transactions to memory device 140, and manages the timing associated with the transaction. In one embodiment, transactions have deterministic timing, which can be managed by memory controller 120 and used in determining how to schedule the transactions.

Referring again to memory controller 120, memory controller 120 includes command (CMD) logic 124, which represents logic or circuitry to generate commands to send to memory devices 140. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 140, memory controller 120 can issue commands via I/O 122 to cause memory device 140 to execute the commands. In one embodiment, controller 150 of memory device 140 receives and decodes command and address information received via I/O 142 from memory controller 120. Based on the received command and address information, controller 150 can control the timing of operations of the logic and circuitry within memory device 140 to execute the commands. Controller 150 is responsible for compliance with standards or specifications within memory device 140, such as timing and signaling requirements. Memory controller 120 can implement compliance with standards or specifications by access scheduling and control.

In one embodiment, memory controller 120 includes refresh (REF) logic 126. Refresh logic 126 can be used for memory resources that are volatile and need to be refreshed to retain a deterministic state. In one embodiment, refresh logic 126 indicates a location for refresh, and a type of refresh to perform. Refresh logic 126 can trigger self-refresh within memory device 140, and/or execute external refreshes by sending refresh commands. For example, in one embodiment, system 100 supports all bank refreshes as well as per bank refreshes. All bank refreshes cause the refreshing of a selected bank within all memory devices 140 coupled in parallel. Per bank refreshes cause the refreshing of a specified bank within a specified memory device 140. In one embodiment, controller 150 within memory device 140 includes refresh logic 154 to apply refresh within memory device 140. In one embodiment, refresh logic 154 generates internal operations to perform refresh in accordance with an external refresh received from memory controller 120. Refresh logic 154 can determine if a refresh is directed to memory device 140, and what memory resources 160 to refresh in response to the command.

Referring again to logic 180, in one embodiment, logic 180 buffers certain signal lines 182 from the host to memory devices 142. In one embodiment, logic 180 buffers data signal lines of DQ 136 as DQ 186, and buffers command (or command and address) lines of CMD 134 as CMD 184. In one embodiment, DQ 186 is buffered, but includes the same number of signal lines as DQ 136. Thus, both are illustrated as having X signal lines. In contrast, CMD 134 has fewer signal lines than CMD 184. Thus, P>N. The N signal lines of CMD 134 are operated at a data rate that is higher than the P signal lines of CMD 184. For example, P can equal 2N, and CMD 184 can be operated at a data rate of ½ the data rate of CMD 134.

Thus, system 100 can include a memory circuit, which can be or include logic 180. To the extent that the circuit is considered to be logic 180, it can refer to a circuit or component (such as one or more discrete elements, or one or more elements of a logic chip package) that buffers the command bus. To the extent the circuit is considered to include logic 180, the circuit can include the pins of packaging of the one or more components, and may include the signal lines. The memory circuit includes an interface to the N signal lines of CMD 134, which are to be operated at a first data rate. The N signal lines of CMD 134 are host-facing with respect to logic 180. The memory circuit can also include an interface to the P signal lines of CMD 184, which are to be operated at a second data rate lower than the first data rate. The P signal lines of CMD 184 are memory-facing with respect to logic 180. Logic 180 can either be considered to be the control logic that receives the command signals and provides them to the memory devices, or can include control logic within it (e.g., its processing elements or logic core) that receive the command signals and provide them to the memory devices.

Figure 2:
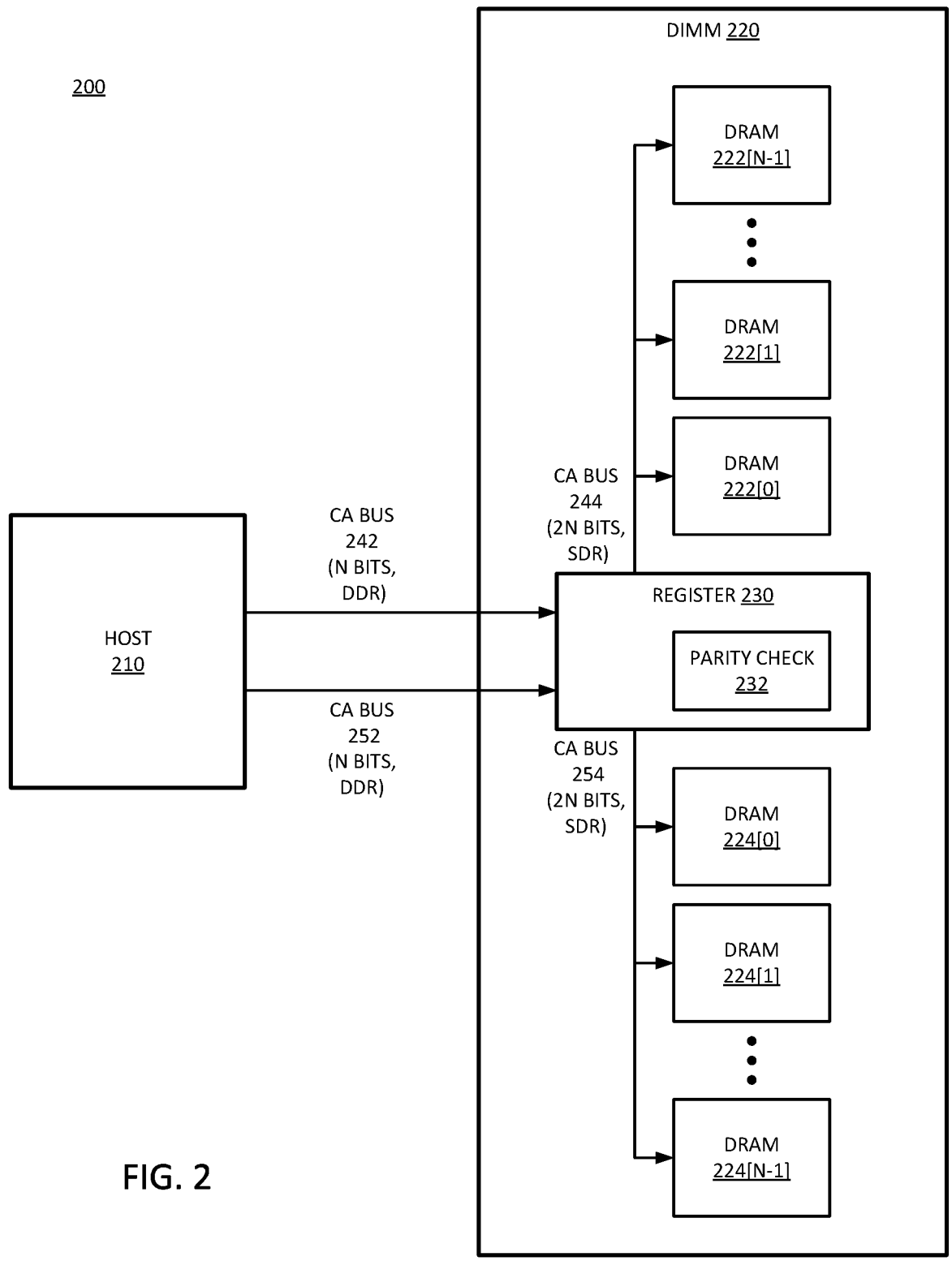
FIG. 2 is a block diagram of an embodiment of a system with a memory module, with a double data rate command bus between the host and the module, and a single data rate command bus to the memory devices on the module.

FIG. 2 is a block diagram of an embodiment of a system with a memory module, with a double data rate command bus between the host and the module, and a single data rate command bus to the memory devices on the module. System 200 represents one embodiment of system 100 of FIG. 1. Host 210 represents a processor or a memory controller, or both. In one embodiment, host 210 includes a central processing unit (CPU) of system 200, which can include an embedded memory controller (iMC) or a separate memory controller. In one embodiment, host 210 can include a graphics processor or graphics processing unit (GPU) that includes or couples to a memory controller to couple to memory.

DIMM 220 represents a memory module with multiple memory devices, and can generically be referred to as "memory". In one embodiment, system 200 includes multiple DIMMs 220, each of which include multiple memory devices or DRAM devices 222 and 224. DIMM 220 is illustrated to include register 230, which can be or include logic to control the sending of commands to the DRAM devices. Reference to the control logic of DIMM 220 as "register 230" is one possible implementation. A register refers to a logic circuit that can buffer signals to the memory. More specifically, the register can register the individual memory devices, to store configuration settings related to the exchange of signals between the register and the memory devices. Register 230 could alternatively be a buffer in another possible implementation. A buffer will buffer the signals, but may not register the memory devices or store specific I/O settings relative to each memory device. Buffering the signal can refer to temporarily storing a signal and re-driving the signal. The storing can be in a register or buffer or other storage device.

In one embodiment, register 230 is part of a DIMM controller (not specifically shown). The DIMM controller refers to a controller or control logic that controls the sending of signals to and from DIMM 220. The DIMM controller can manage timing and signaling on DIMM 220. The DIMM controller can be implemented as a microcontroller, microprocessor, or other controller. The DIMM controller will be understood as being separate from a controller on the individual DRAM devices, and separate from the memory controller of the host. In one embodiment, register 230 is separate from the DIMM controller.

In one embodiment, register 230 or a DIMM controller includes parity check logic 232. Parity check logic can include logic to enable the determination of parity on incoming commands, to compare the parity computation against a received parity signal. Simple parity is typically performed as Even/Odd, with a zero parity bit representing even parity, and a one parity bit representing odd parity. Even/Odd parity can be computed via multiple stages of XOR (exclusive OR) or other combinatorial logic. It will be understood that since XOR functions are commutable, any combination of XOR on the inputs should result in the same outcome. The number of stages of XOR is determined by the number of signals lines over which to compute parity. Parity for the command buses can be simplified with narrower buses, by reducing the number of XOR stages. In one embodiment, host 210 includes control logic to trigger sending of a parity bit signal having the same timing as the command and address bits. Thus, the parity bit signal will match the data rate of the command and address bits. In one embodiment, when CA bus 242 or CA bus 252 operates at a higher data rate, the parity signal sent for computation of parity by parity check 232 is also sent at the higher data rate.

In one embodiment, register 230 receives the signal lines in a point-to-point connection from host 210, and sends signals to the DRAM devices via a multi-drop bus or fly-by topology, where all devices are coupled to a common bus or common signal line. It will be understood that reference to DRAM devices 222 is a shorthand to represent the N DRAM devices 222[0] to 222[N−1], and similarly reference to DRAM devices 224 is a shorthand to represent the N DRAM devices 224[0] to 224[N−1].

In one embodiment, the connection or interface between host 210 and register 230 includes two C/A buses, 242 and 252, which can correspond to different memory channels. Separation of the devices into different channels can increase throughput while reducing physical footprint and the number of connectors needed. However, it can increase the number of signal lines between host 210 and DIMM 220. When C/A bus 242 and C/A bus 252 are N-bit buses operated at double data rate, two channels can be included with the same number of signal lines as would previously be needed for a single channel. Thus, DRAM devices with higher densities (e.g., such as stacked device packages) can be included in system 200 to increase memory capacity, while maintaining or improving throughput performance.

While, C/A bus 242 and C/A bus 252 include N signal lines, the C/A buses on DIMM 220 are illustrated as including 2N bits, or 2N signal lines. The reference to 2N bits refers to how many bits can be transferred in a single transfer cycle (e.g., clock cycle or UI (unit interval)), and corresponds to the number of signal lines. The reference to the 2N signal lines more explicitly refers to the hardware architecture. Thus, there can be mismatch between the bus width from host 210 to DIMM 220 (and register 230 on DIMM 220), and the bus width from register 230 to DRAM devices 222 and 224. The mismatch illustrated is that C/A bus 242 includes N bits and C/A bus 244, which provides the command signals of C/A bus 242 to DRAM devices 222, includes 2N bits. Similarly, C/A bus 252 includes N bits and C/A bus 254, which provides the command signals of C/A bus 252 to DRAM devices 224, includes 2N bits.

It will be understood that C/A bus 244 carries the command signals of C/A bus 242 to DRAMs 222. Thus, from one perspective, C/A bus 242 and C/A bus 244 can be considered the same command bus, such as having two portions, the narrow C/A bus portion (C/A bus 242) and the wide or standard C/A bus portion (C/A bus 244). Alternatively, the separate portions can be considered a host side portion (C/A bus 242) and a memory side portion (C/A bus 244). Alternatively, the separate portions can be considered separate buses that are mapped by register 230. The same discussion can apply to C/A bus 252 and C/A bus 254. It will be observed that the different portions or buses have different data rates. It will be understood that "data rate" refers to the rate at which information is sent over the signal lines, and is not limited to the sending of data bits over a data bus. System 200 includes one or more data buses, which are not explicitly illustrated, for purposes of simplicity in the drawing. Thus, the data rate of C/A buses 242 and 252 is DDR, referring to the transfer of a bit of data on every clock edge, whereas the data rate of C/A buses 244 and 254 is SDR, referring to the transfer of a data bit on only every other clock edge.

With respect to a traditional DIMM, DIMM 220 has a reduced pin count per channel between host 210 and DIMM 220. Such a reduced pin count can be used to either actually reduce the pin count of system 200 or increase the pin usage. Actually reducing the pin count can refer to eliminating signal lines and connectors from the hardware of system 200, such as traces, pads, and connectors on a motherboard PCB (printed circuit board), and traces, pads, and connectors on the DIMM PCB. The increased utilization of one DIMM may not effectively reduce the pin count of that DIMM, but may reduce system pin count by enabling the removal of one or more connectors that would previously be considered necessary to achieve desired memory capacities. In one embodiment, host 210 can select between driving the signal lines of C/A buses 242 and 252 as DDR or SDR. For example, a memory controller (not explicitly shown) can be configured to drive the C/A buses as DDR when a DIMM 220 with a supporting register 230 is coupled. If a connected DIMM does not support receiving a DDR C/A signal, in one embodiment the memory controller can drive C/A buses 242 and 252 as a single C/A bus, which register 230 can provide to all memory devices 222 and 224. Thus, in one embodiment, system 200 can support operating C/A buses 242 and 252 at DDR or at SDR. Such a configuration can be supported, for example, by configuration settings of the memory controller. Thus, a common memory controller can be used to drive either a standard or a narrow C/A bus.

Figure 3A:
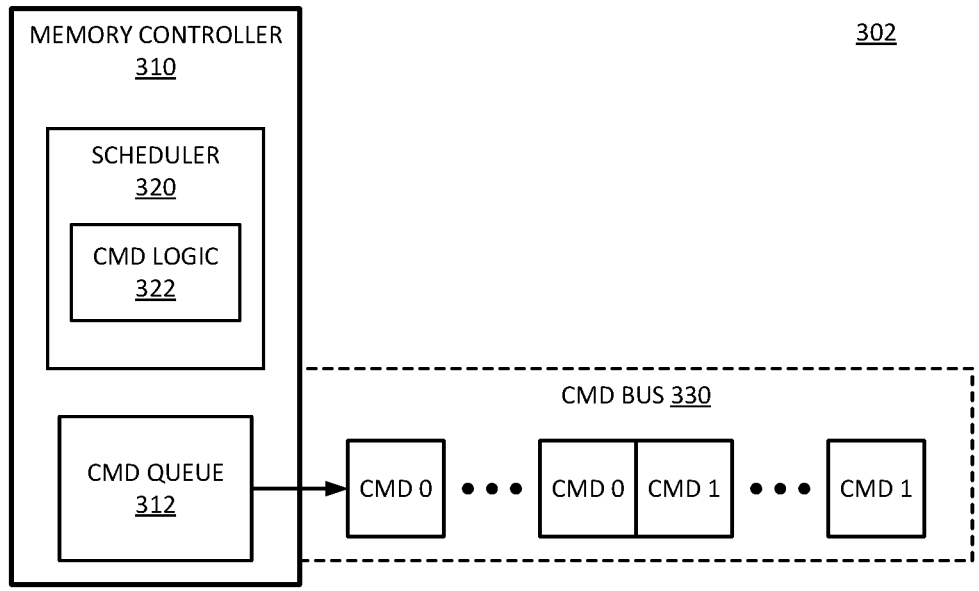
FIG. 3A is a block diagram of an embodiment of a system with a double data rate command bus with command signal bursts.

FIG. 3A is a block diagram of an embodiment of a system with a double data rate command bus with command signal bursts. Circuit 302 represents a memory controller circuit in accordance with an embodiment of system 100 or system 200. Circuit 302 includes memory controller 310. Memory controller 310 manages access to one or more associated memory devices. An associated memory device is one that is coupled to a bus managed by memory controller 310. In a system with multiple memory controllers, certain memory controllers will be associated with selected memory devices.

Memory controller 310 includes scheduler 320, which represents logic in the controller to determine what signals to send to memory to cause the performance of desired operations. In one embodiment, scheduler 320 can be considered to include command (CMD) logic 322 to determine what command signals to generate to cause certain memory access operations (e.g., read or write) or memory management operations (e.g., refresh, mode register set). For example, for a Read operation, command logic 322 can select from among various different types of Read commands permissible for the memory device and an address for the Read command.

Command logic 322 can generate the Read command with the address information, and scheduler 320 can determine timing for the command. The timing can be related to compliance with a standard, or to coordination with other commands or operations, or to a combination. Scheduler 320 can store the command in command queue 312 based on the determined timing information. In one embodiment, the timing information can include determining how and when to send command signals for a command bus interface that is operated faster than a command interface of the memory devices. For example, in accordance with system 200, the timing can include determination of timing and coordination of sending signals on a double data rate command bus 330.

When it is time for the command to be sent to the memory, memory controller 310 can dequeue the command signal or signals from command queue 312 and transmit them over command bus 330. As illustrated in circuit 302, memory controller 310 operates command bus 330 at double data rate, and sends one command right after the other. As illustrated, a command may include multiple bits, referring to a command that includes bits sent in sequence over multiple unit intervals (e.g., such as LPDDR commands). The illustration is intended to be general, and it will be understood that some commands occur in a single cycle. Thus, for example, by bursting the commands with DDR instead of SDR, memory controller 310 may send a single UI for CMD 0, and then a single UI for CMD 1. Alternatively, a burst of commands could include multiple UIs for CMD 0 followed by multiple UIs for CMD 1, for example.

Figure 3B:
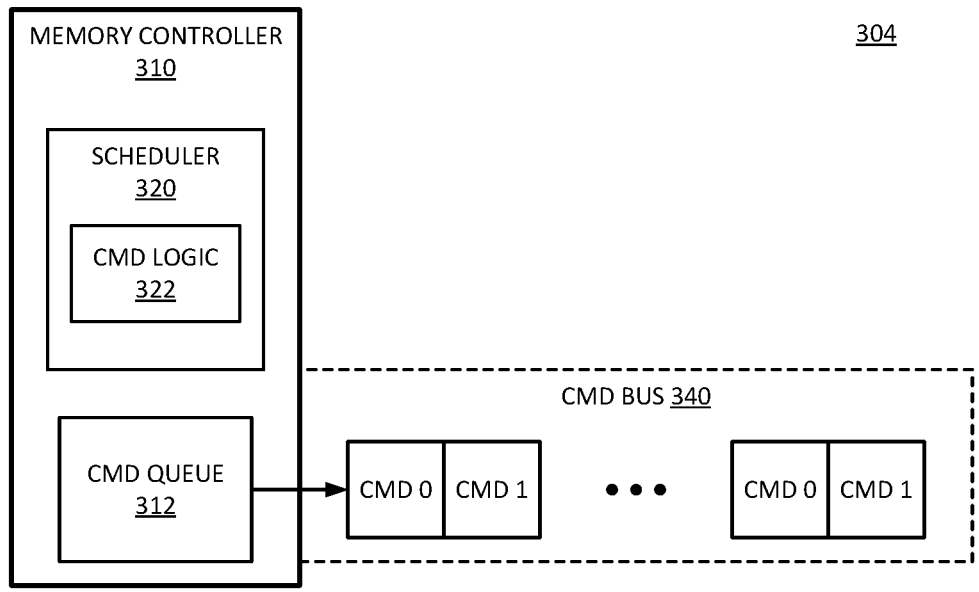
FIG. 3B is a block diagram of an embodiment of a system with a double data rate command bus with interleaved command signals.

FIG. 3B is a block diagram of an embodiment of a system with a double data rate command bus with interleaved command signals. Circuit 304 can be the same or similar to circuit 302 of FIG. 3A, with the exception of operating command bus 340 with a double data rate, and interleaving the command signals. It will be understood that interleaving command signals may only have meaning when there are multiple UIs of command signals for each command or each channel to send. For example, memory controller 310 can dequeue command signals from command queue 312 onto command bus 340, sending a UI of CMD 0, followed by a UI of CMD 1, followed by a UI of CMD 0, and so forth until all command signal UIs are sent for both commands. In one embodiment, the commands are two consecutive commands for the same channel. In one embodiment, the two commands are commands for separate channels.

Figure 4A:
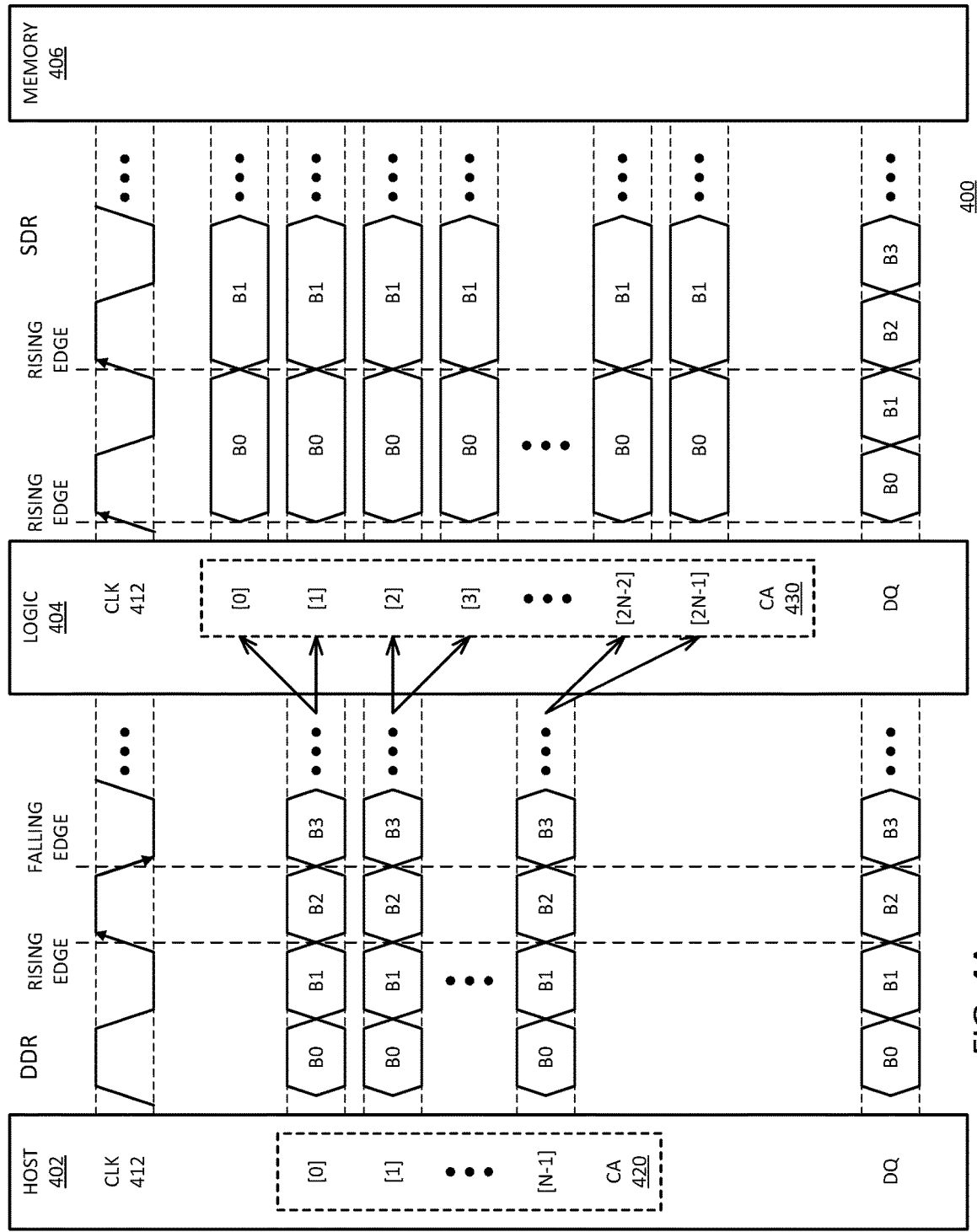
FIG. 4A is a timing diagram of an embodiment of relative signaling timing for a double data rate command bus.

FIG. 4A is a timing diagram of an embodiment of relative signaling timing for a double data rate command bus. System 400 includes host 402, logic 404, and memory 406. System 400 provides a representation of relative timing between the host, the buffer logic, and the memory. System 400 provides one example of an embodiment of a system in accordance with system 100 or system 200. Logic 404 represents any embodiment of a buffer or register described herein, and can be or be part of a memory circuit. For purposes of understanding the drawing, the bits sent first in time are the farthest to the left. Thus, moving from left to right on a specific bus illustrates data bits transferred as time advances.

Host 402 represents a host in accordance with any embodiment described herein, and includes at least logic to manage access to the memory. For example, host 402 can include a host processor and a memory controller circuit. Host 402 includes hardware interfaces to one or more clock signal lines 412, and can drive the clock signal on the signal lines. As illustrated, clock signal lines 412 can be driven with a clock signal that has a rising edge, and a falling edge. The rising edge refers to a transition from a low logic value (e.g., a '0') to a high logic value (e.g., a '1'). The falling edge refers to the opposite transition, from a high logic value to a low logic value. As illustrated with the bus connection between logic 404 and memory 406, SDR refers to transmission of a data bit on a single edge type, thus, transferring data for every other clock cycle edge. In the illustration, data transfer is triggered with a rising edge, which is one example, and other systems can use the falling edge. As illustrated with the bus connection between host 402 and logic 404, DDR refers to transmission of a data bit in response to both types of clock edges.

System 400 illustrates DQ or an interface to a data bus both on the bus connection between host 402 and logic 404, as well as on the bus connection between logic 404 and memory 406. There is only one data signal line illustrated for purposes of comparison with the command signals. It will be observed that for both bus connections, the data signals are operated at DDR. In one embodiment, the command signals are operated at DDR on the host-logic connection, and at SDR on the logic-memory connection.

More specifically regarding the command signaling, host 402 is shown to include interfaces to C/A 420, which includes N signal lines operated at DDR. While not specifically shown, it will be understood that logic 404 includes a corresponding interface. Logic 404 is shown to include interfaces to C/A 430, which includes 2N signal lines operated at SDR. While not specifically shown, it will be understood that memory 406 includes a corresponding interface. In one embodiment, the data transferred on the signal lines of C/A 420 are separated to be transferred on the signal lines of C/A 430. A simple possible mapping is illustrated, where line 0 of C/A 420 maps to lines 0 and 1 of C/A 430, line 1 of C/A 420 maps to lines 2 and 3 of C/A 430, and so forth. It will be understood that other mappings could be made. Logic 404 can map the signal lines of C/A 420 to C/A 430.

As illustrated in system 400, in one embodiment, host 402 provides a memory channel to the memory devices, and the signal lines are buffered through logic 404. In one embodiment, logic 404 can receive two or more channels from host 402. A memory channel includes a command bus or C/A bus 420. C/A bus 420 can be half the width (half as many signal lines), and running twice as fast (double the data rate). Logic 404 can then forward the command signals on C/A bus 430 at half the rate (single data rate) but on double the width (twice as many signal lines).

Figure 4B:
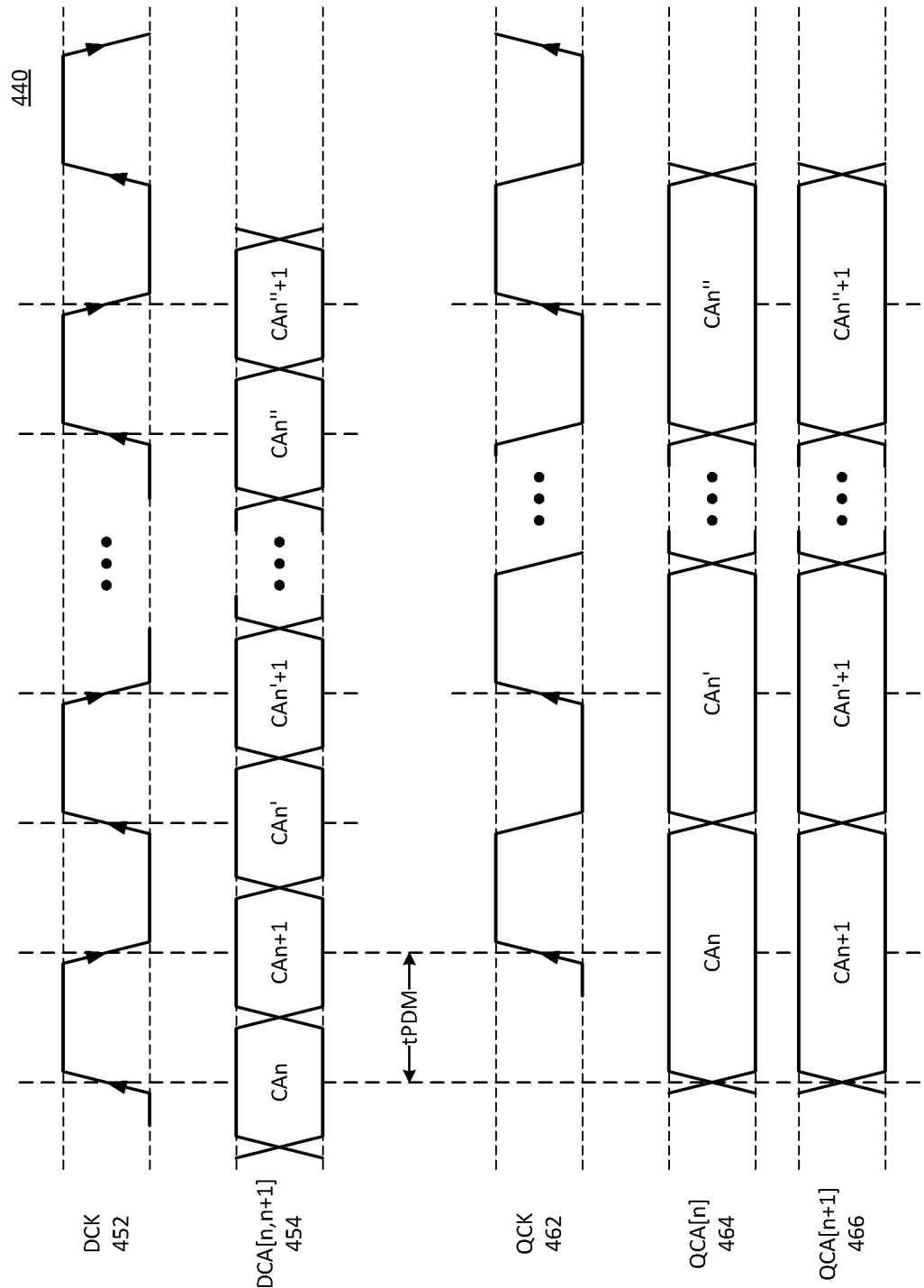
FIG. 4B is a timing diagram of an embodiment of relative signaling timing illustrating a double data rate command bus and single data rate command buses.

FIG. 4B is a timing diagram of an embodiment of relative signaling timing illustrating a double data rate command bus and single data rate command buses. Diagram 440 provides an example of a comparison of the command data rates for a system in accordance with an embodiment of system 400 of FIG. 4A. Timing diagram 440 can be in accordance with other embodiments described herein of a system that provides a double data rate command bus. Clock signal DCK 452 represents a double data rate clock, which is a clock used to transfer the command and address information from a host to a memory module, for example. As illustrated, DCK 452 triggers on the rising and falling edges of the clock signal. Clock signal QCK 462 represents a single data rate clock as applied at the memory devices themselves. QCK 462 is used to transfer the command and address information to specific memory devices. As illustrated, QCK 462 triggers on the rising edges of the clock signal. Alternatively the falling edges could be used. DCK 452 represents a clock between a host and a group of memory devices and more specifically to logic that will separate the double data rate command information to single data rate, and QCK 462 represents a clock to the memory devices from the decode logic.

The command and address signal DCA 454 represents command and address information for channel N and for channel N+1. As illustrated, the command and address information is interleaved, with command and address information for channel N triggering on the rising clock edges. Thus, CAn, CAn', and CAn" align with the rising clock edges of DCK 452, and represent command and address bits for the first channel. The command and address information for channel N+1 triggers on the falling clock edges, with CAn+1, CAn'+1, and CAn"+1 aligned with the falling clock edges of DCK 452. The signals represent command and address bits for the second channel.

In one embodiment, the time between the rising and the falling edges of the clock signal are tPDM. In one embodiment, there is a delay of tPDM from the rising edge of DCK 452 to the rising edge of QCK 462. The command and address signals QCA 464 (for channel N) and QCA 466 (for channel N+1) represent command and address information separated to be transferred to specific memory devices. It will be observed that command and address information bit CAn as represented in QCA 464 is twice the width of CAn as represented in DCQ 454. The same is true for the other command and address information bits in QCA 464 and QCA 466. In one embodiment, the receive and processing logic that separates the double data rate command and address information provides command and address information with timing in accordance with single data rate to the memory devices.

Figure 5:
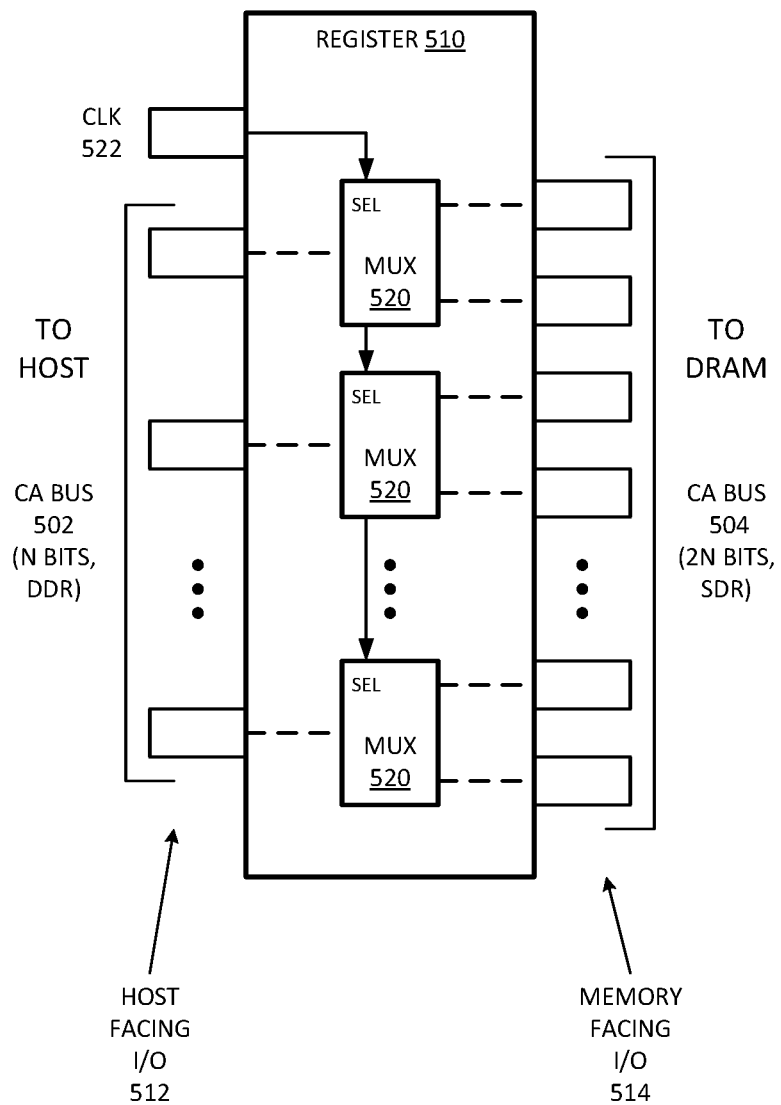
FIG. 5 is a block diagram of an embodiment of a register to couple to a host via a double data rate command bus and to memory via a single data rate command bus.

FIG. 5 is a block diagram of an embodiment of a register to couple to a host via a double data rate command bus and to memory via a single data rate command bus. Circuit 500 includes register 510, and can represent a memory circuit or logic of system 100 or system 200. Circuit 500 can represent a circuit of system 400.

Register 510 includes host facing interface or host facing I/O 512 and memory facing interface or memory facing I/O 514. Host facing I/O 512 provides an interface to C/A bus 502, which connects to a host. Memory facing I/O 514 provides an interface to C/A bus 504, which connects to DRAM devices or other memory devices. C/A bus 502 includes fewer signal lines or fewer bits than C/A bus 504, and is to operate at a higher data rate. In one embodiment, C/A bus 502 includes N bits and operates at DDR, while C/A bus 504 includes 2N bits and operates at SDR.

In one embodiment, register 510 includes multiple multiplexers (muxes) 520. In one embodiment, muxes 520 are 1:2 multiplexers selected or steered by the clock polarity. Thus, clock signal 522 is illustrated in circuit 500 to provide a signal to the select input of muxes 520. In one embodiment, the clock-selected muxes steer incoming signal bits to even and odd numbered address lines of C/A bus 504 to the one or more DRAM devices. Thus, register 510 can effectively double the bus width to the DRAM devices attached to register 510. The signals from the signal lines operated at the higher data rate can be selectively placed on signal lines operated at the slower data rate.

Figure 6:
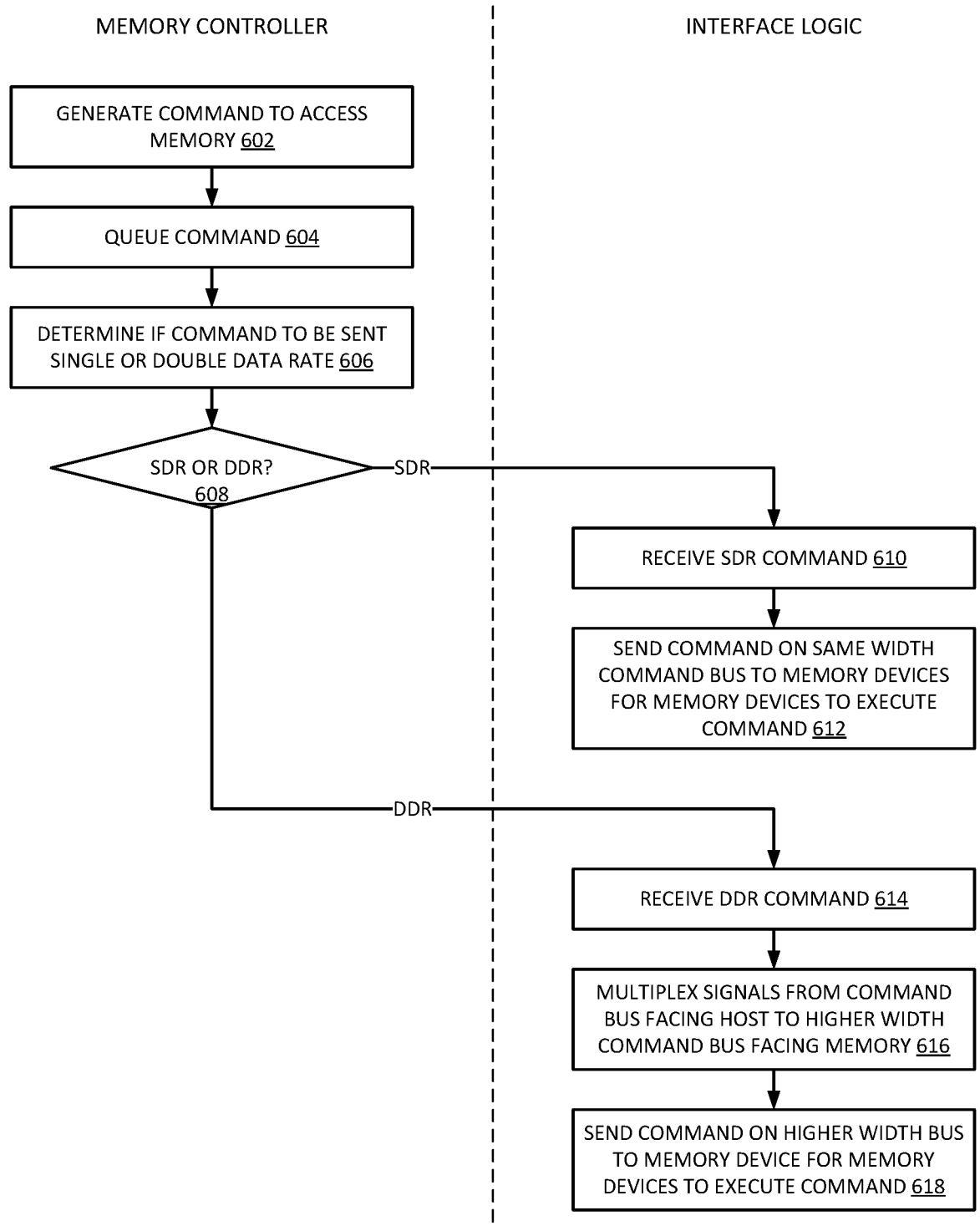
FIG. 6 is a flow diagram of an embodiment of a process for sending commands on a double data rate command bus.

FIG. 6 is a flow diagram of an embodiment of a process for sending commands on a double data rate command bus. The flow diagram illustrates operations that can be performed by a memory controller and interface logic that buffers commands sent from the memory controller to the memory devices.

In one embodiment, the memory controller generates a command to access memory, 602. The command can be for a Read operation, a Write operation, or other command. In one embodiment, the memory controller determines scheduling information for the command and queues the command, 604. The command is represented to the memory devices by a group of bits provided on multiple signal lines, which can be referred to as the command bus. The pattern of ones and zeros of the command bus signal lines indicates an operation to the memory.

In one embodiment, the memory controller supports operating the command bus interface at single data rate or double data rate. For example, the memory controller could include configuration settings to operate the command bus signal lines at lower or higher data rate. Thus, in one embodiment, the memory controller determines if the queued command is to be sent at single data rate or double data rate, 606.

In one embodiment, if the command is to be sent out at SDR, 608 SDR branch, the memory controller is configured for traditional operation. With SDR, the memory controller sends the command, and the interface logic receives the SDR command, 610. The interface logic can then send the command to the memory devices on a command bus of the same width as the command bus from the memory controller, and the memory devices will execute the command, 612.

In one embodiment, if the command is to be sent out at DDR, 608 DDR branch, the memory controller is configured to operate the command bus at a higher data rate, and the command bus has a narrower width than the traditional command bus. With DDR, the memory controller sends the DDR command, and the interface logic receives the DDR command, 614. The interface logic processes the DDR command to map the command to more signal lines of the command bus to the memory devices. In one embodiment, the interface logic includes multiplexers to multiplex the DDR command signals from the host facing command bus to a higher width command bus facing the memory, 616. The interface logic sends the command signals on the higher width command bus to the memory devices for the memory devices to execute the command, 618.

Figure 7:
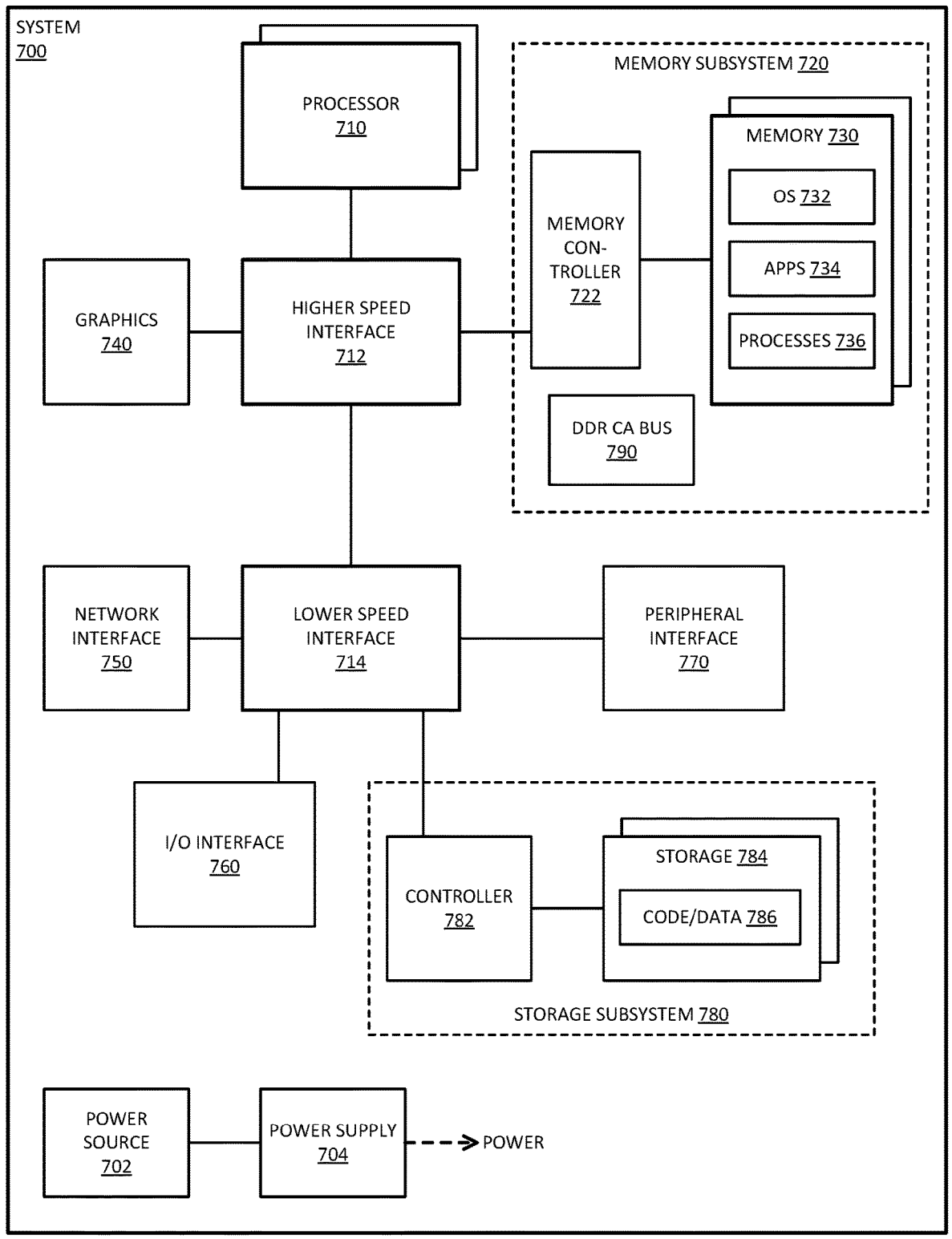
FIG. 7 is a block diagram of an embodiment of a computing system in which a double data rate command bus can be implemented.

FIG. 7 is a block diagram of an embodiment of a computing system in which a double data rate command bus can be implemented. System 700 represents a computing device in accordance with any embodiment described herein, and can be a laptop computer, a desktop computer, a tablet computer, a server, a gaming or entertainment control system, a scanner, copier, printer, routing or switching device, embedded computing device, a smartphone, a wearable device, an internet-of-things device or other electronic device.

System 700 includes processor 710, which provides processing, operation management, and execution of instructions for system 700. Processor 710 can include any type of microprocessor, central processing unit (CPU), graphics processing unit (GPU), processing core, or other processing hardware to provide processing for system 700, or a combination of processors. Processor 710 controls the overall operation of system 700, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one embodiment, system 700 includes interface 712 coupled to processor 710, which can represent a higher speed interface or a high throughput interface for system components that needs higher bandwidth connections, such as memory subsystem 720 or graphics interface components 740. Interface 712 can represent a "north bridge" circuit, which can be a standalone component or integrated onto a processor die. Where present, graphics interface 740 interfaces to graphics components for providing a visual display to a user of system 700. In one embodiment, graphics interface 740 can drive a high definition (HD) display that provides an output to a user. High definition can refer to a display having a pixel density of approximately 100 PPI (pixels per inch) or greater, and can include formats such as full HD (e.g., 1080p), retina displays, 4K (ultra high definition or UHD), or others. In one embodiment, the display can include a touchscreen display. In one embodiment, graphics interface 740 generates a display based on data stored in memory 730 or based on operations executed by processor 710 or both.

Memory subsystem 720 represents the main memory of system 700, and provides storage for code to be executed by processor 710, or data values to be used in executing a routine. Memory subsystem 720 can include one or more memory devices 730 such as read-only memory (ROM), flash memory, one or more varieties of random access memory (RAM) such as DRAM, or other memory devices, or a combination of such devices. Memory 730 stores and hosts, among other things, operating system (OS) 732 to provide a software platform for execution of instructions in system 700. Additionally, applications 734 can execute on the software platform of OS 732 from memory 730. Applications 734 represent programs that have their own operational logic to perform execution of one or more functions. Processes 736 represent agents or routines that provide auxiliary functions to OS 732 or one or more applications 734 or a combination. OS 732, applications 734, and processes 736 provide software logic to provide functions for system 700. In one embodiment, memory subsystem 720 includes memory controller 722, which is a memory controller to generate and issue commands to memory 730. It will be understood that memory controller 722 could be a physical part of processor 710 or a physical part of interface 712. For example, memory controller 722 can be an integrated memory controller, integrated onto a circuit with processor 710.

While not specifically illustrated, it will be understood that system 700 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire").

In one embodiment, system 700 includes interface 714, which can be coupled to interface 712. Interface 714 can be a lower speed interface than interface 712. In one embodiment, interface 714 can be a "south bridge" circuit, which can include standalone components and integrated circuitry. In one embodiment, multiple user interface components or peripheral components, or both, couple to interface 714. Network interface 750 provides system 700 the ability to communicate with remote devices (e.g., servers or other computing devices) over one or more networks. Network interface 750 can include an Ethernet adapter, wireless interconnection components, cellular network interconnection components, USB (universal serial bus), or other wired or wireless standards-based or proprietary interfaces. Network interface 750 can exchange data with a remote device, which can include sending data stored in memory or receiving data to be stored in memory.

In one embodiment, system 700 includes one or more input/output (I/O) interface(s) 760. I/O interface 760 can include one or more interface components through which a user interacts with system 700 (e.g., audio, alphanumeric, tactile/touch, or other interfacing). Peripheral interface 770 can include any hardware interface not specifically mentioned above. Peripherals refer generally to devices that connect dependently to system 700. A dependent connection is one where system 700 provides the software platform or hardware platform or both on which operation executes, and with which a user interacts.

In one embodiment, system 700 includes storage subsystem 780 to store data in a nonvolatile manner. In one embodiment, in certain system implementations, at least certain components of storage 780 can overlap with components of memory subsystem 720. Storage subsystem 780 includes storage device(s) 784, which can be or include any conventional medium for storing large amounts of data in a nonvolatile manner, such as one or more magnetic, solid state, or optical based disks, or a combination. Storage 784 holds code or instructions and data 786 in a persistent state (i.e., the value is retained despite interruption of power to system 700). Storage 784 can be generically considered to be a "memory," although memory 730 is typically the executing or operating memory to provide instructions to processor 710. Whereas storage 784 is nonvolatile, memory 730 can include volatile memory (i.e., the value or state of the data is indeterminate if power is interrupted to system 700). In one embodiment, storage subsystem 780 includes controller 782 to interface with storage 784. In one embodiment controller 782 is a physical part of interface 714 or processor 710, or can include circuits or logic in both processor 710 and interface 714.

Power source 702 provides power to the components of system 700. More specifically, power source 702 typically interfaces to one or multiple power supplies 704 in system 702 to provide power to the components of system 700. In one embodiment, power supply 704 includes an AC to DC (alternating current to direct current) adapter to plug into a wall outlet. Such AC power can be renewable energy (e.g., solar power) power source 702. In one embodiment, power source 702 includes a DC power source, such as an external AC to DC converter. In one embodiment, power source 702 or power supply 704 includes wireless charging hardware to charge via proximity to a charging field. In one embodiment, power source 702 can include an internal battery or fuel cell source.

In one embodiment, system 700 includes a double data rate command address (DDR CA) bus 790, which represents a bus architecture in which a logic circuit receives command and address information on a narrow width command bus at a higher data rate, and sends the command and address information to one or more memory devices on a wider width command bus at a lower data rate. The lower data rate can be a standard data rate for traditional command signaling, such as SDR. The higher data rate can be DDR. The higher width command bus can be a standard with command bus, referring to a bus that has a number of signal lines set out by a standard for interfacing with a memory device. The lower width command bus is narrower than the command bus width used by the memory device. It will be understood that such an architecture will include control logic to receive the command signals from the host at the higher rate and send out the command signals to the memory at the lower rate. The receiving and transmitting can be in accordance with any embodiment described herein.

Figure 8:
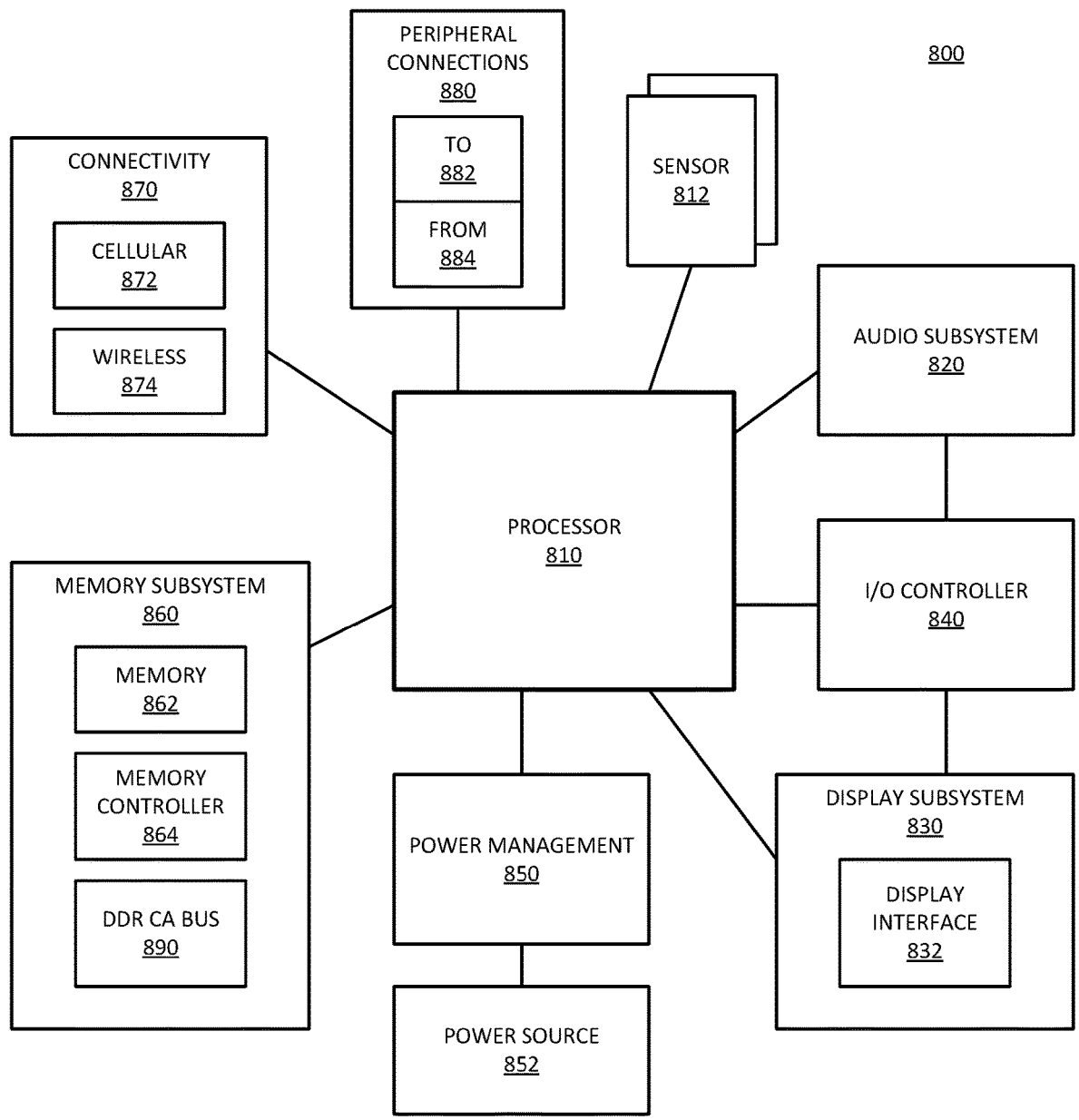
FIG. 8 is a block diagram of an embodiment of a mobile device in which a double data rate command bus can be implemented.

FIG. 8 is a block diagram of an embodiment of a mobile device in which a double data rate command bus can be implemented. Device 800 represents a mobile computing device, such as a computing tablet, a mobile phone or smartphone, a wireless-enabled e-reader, wearable computing device, an internet-of-things device or other mobile device, or an embedded computing device. It will be understood that certain of the components are shown generally, and not all components of such a device are shown in device 800.

Device 800 includes processor 810, which performs the primary processing operations of device 800. Processor 810 can include one or more physical devices, such as microprocessors, application processors, microcontrollers, programmable logic devices, or other processing means. The processing operations performed by processor 810 include the execution of an operating platform or operating system on which applications and device functions are executed. The processing operations include operations related to I/O (input/output) with a human user or with other devices, operations related to power management, operations related to connecting device 800 to another device, or a combination. The processing operations can also include operations related to audio I/O, display I/O, or other interfacing, or a combination. Processor 810 can execute data stored in memory. Processor 810 can write or edit data stored in memory.

In one embodiment, system 800 includes one or more sensors 812. Sensors 812 represent embedded sensors or interfaces to external sensors, or a combination. Sensors 812 enable system 800 to monitor or detect one or more conditions of an environment or a device in which system 800 is implemented. Sensors 812 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 812 can also include sensors for biometric systems such as fingerprint recognition systems, face detection or recognition systems, or other systems that detect or recognize user features. Sensors 812 should be understood broadly, and not limiting on the many different types of sensors that could be implemented with system 800. In one embodiment, one or more sensors 812 couples to processor 810 via a frontend circuit integrated with processor 810. In one embodiment, one or more sensors 812 couples to processor 810 via another component of system 800.

In one embodiment, device 800 includes audio subsystem 820, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into device 800, or connected to device 800. In one embodiment, a user interacts with device 800 by providing audio commands that are received and processed by processor 810.

Display subsystem 830 represents hardware (e.g., display devices) and software components (e.g., drivers) that provide a visual display for presentation to a user. In one embodiment, the display includes tactile components or touchscreen elements for a user to interact with the computing device. Display subsystem 830 includes display interface 832, which includes the particular screen or hardware device used to provide a display to a user. In one embodiment, display interface 832 includes logic separate from processor 810 (such as a graphics processor) to perform at least some processing related to the display. In one embodiment, display subsystem 830 includes a touchscreen device that provides both output and input to a user. In one embodiment, display subsystem 830 includes a high definition (HD) display that provides an output to a user. High definition can refer to a display having a pixel density of approximately 100 PPI (pixels per inch) or greater, and can include formats such as full HD (e.g., 1080p), retina displays, 4K (ultra high definition or UHD), or others. In one embodiment, display subsystem includes a touchscreen display. In one embodiment, display subsystem 830 generates display information based on data stored in memory or based on operations executed by processor 810 or both.

I/O controller 840 represents hardware devices and software components related to interaction with a user. I/O controller 840 can operate to manage hardware that is part of audio subsystem 820, or display subsystem 830, or both. Additionally, I/O controller 840 illustrates a connection point for additional devices that connect to device 800 through which a user might interact with the system. For example, devices that can be attached to device 800 might include microphone devices, speaker or stereo systems, video systems or other display device, keyboard or keypad devices, or other I/O devices for use with specific applications such as card readers or other devices.

As mentioned above, I/O controller 840 can interact with audio subsystem 820 or display subsystem 830 or both. For example, input through a microphone or other audio device can provide input or commands for one or more applications or functions of device 800. Additionally, audio output can be provided instead of or in addition to display output. In another example, if display subsystem includes a touchscreen, the display device also acts as an input device, which can be at least partially managed by I/O controller 840. There can also be additional buttons or switches on device 800 to provide I/O functions managed by I/O controller 840.

In one embodiment, I/O controller 840 manages devices such as accelerometers, cameras, light sensors or other environmental sensors, gyroscopes, global positioning system (GPS), or other hardware that can be included in device 800, or sensors 812. The input can be part of direct user interaction, as well as providing environmental input to the system to influence its operations (such as filtering for noise, adjusting displays for brightness detection, applying a flash for a camera, or other features).

In one embodiment, device 800 includes power management 850 that manages battery power usage, charging of the battery, and features related to power saving operation. Power management 850 manages power from power source 852, which provides power to the components of system 800. In one embodiment, power source 852 includes an AC to DC (alternating current to direct current) adapter to plug into a wall outlet. Such AC power can be renewable energy (e.g., solar power, motion based power). In one embodiment, power source 852 includes only DC power, which can be provided by a DC power source, such as an external AC to DC converter. In one embodiment, power source 852 includes wireless charging hardware to charge via proximity to a charging field. In one embodiment, power source 852 can include an internal battery or fuel cell source.

Memory subsystem 860 includes memory device(s) 862 for storing information in device 800. Memory subsystem 860 can include nonvolatile (state does not change if power to the memory device is interrupted) or volatile (state is indeterminate if power to the memory device is interrupted) memory devices, or a combination. Memory 860 can store application data, user data, music, photos, documents, or other data, as well as system data (whether long-term or temporary) related to the execution of the applications and functions of system 800. In one embodiment, memory subsystem 860 includes memory controller 864 (which could also be considered part of the control of system 800, and could potentially be considered part of processor 810). Memory controller 864 includes a scheduler to generate and issue commands to control access to memory device 862.

Connectivity 870 includes hardware devices (e.g., wireless or wired connectors and communication hardware, or a combination of wired and wireless hardware) and software components (e.g., drivers, protocol stacks) to enable device 800 to communicate with external devices. The external device could be separate devices, such as other computing devices, wireless access points or base stations, as well as peripherals such as headsets, printers, or other devices. In one embodiment, system 800 exchanges data with an external device for storage in memory or for display on a display device. The exchanged data can include data to be stored in memory, or data already stored in memory, to read, write, or edit data.

Connectivity 870 can include multiple different types of connectivity. To generalize, device 800 is illustrated with cellular connectivity 872 and wireless connectivity 874. Cellular connectivity 872 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 874 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 880 include hardware interfaces and connectors, as well as software components (e.g., drivers, protocol stacks) to make peripheral connections. It will be understood that device 800 could both be a peripheral device ("to" 882) to other computing devices, as well as have peripheral devices ("from" 884) connected to it. Device 800 commonly has a "docking" connector to connect to other computing devices for purposes such as managing (e.g., downloading, uploading, changing, synchronizing) content on device 800. Additionally, a docking connector can allow device 800 to connect to certain peripherals that allow device 800 to control content output, for example, to audiovisual or other systems.

In addition to a proprietary docking connector or other proprietary connection hardware, device 800 can make peripheral connections 880 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one embodiment, system 800 includes a double data rate command address (DDR CA) bus 890 in memory subsystem 860, which represents a bus architecture in which a logic circuit receives command and address information on a narrow width command bus at a higher data rate, and sends the command and address information to one or more memory devices on a wider width command bus at a lower data rate. The lower data rate can be a standard data rate for traditional command signaling, such as SDR. The higher data rate can be DDR. The higher width command bus can be a standard with command bus, referring to a bus that has a number of signal lines set out by a standard for interfacing with a memory device. The lower width command bus is narrower than the command bus width used by the memory device. It will be understood that such an architecture will include control logic to receive the command signals from the host at the higher rate and send out the command signals to the memory at the lower rate. The receiving and transmitting can be in accordance with any embodiment described herein.

In one aspect, a memory circuit includes: a first group of command signal lines having a first number of signal lines to operate at a first data rate to couple to a memory controller; a second group of command signal lines having a second number of signal lines to operate at a second data rate to couple to one or more memory devices, wherein the first number of signal lines is lower than the second number of signal lines, and the first data rate is higher than the second data rate; and control logic to receive a memory command on the first group of signal lines from the memory controller, and forward the command on the second group of signal lines to the one or more memory devices.

In one embodiment, the second number of signal lines is double the first number of signal lines. In one embodiment, the second data rate is half the first data rate. In one embodiment, the second data rate is single data rate with data bit transfer triggered on either rising or falling edges of a clock signal, and wherein the first data rate is double data rate with data bit transfer triggered on both the rising and falling edges of the clock signal. In one embodiment, further comprising: a multiplexer to receive the first group of command signal lines as input, and selectively output signals from the first group of signal lines to the second group of command signal lines, wherein selection of the multiplexer is controlled by polarity of a clock signal. In one embodiment, the control logic is to receive two interleaved command signals on a single command signal line of the first group of command signal lines, and is to output the two command signals on separate command signal lines of the second group of command signal lines. In one embodiment, the control logic is to receive two bursts of command signals on a single command signal line of the first group of command signal lines, and is to output the two command signals on separate command signal lines of the second group of command signal lines. In one embodiment, the one or more memory devices comprise synchronous dynamic random access memory (SDRAM) devices compliant with a double data rate (DDR) based standard. In one embodiment, the memory circuit comprises a circuit on a dual inline memory module (DIMM). In one embodiment, the memory circuit comprises a register. In one embodiment, the memory circuit comprises a buffer. In one embodiment, the first group of signal lines is capable to operate at either the first data rate or the second data rate. In one embodiment, further comprising: a third group of data signal lines to exchange data between the memory controller and the one or more memory devices, wherein the data signal lines are to operate at the first data rate.

In one aspect, a computing device includes: a dual inline memory module (DIMM), including multiple memory devices; and a logic circuit including a first hardware interface to couple to a memory controller over a first group of command signal lines having a first number of signal lines to operate at a first data rate to couple; and a second hardware interface to couple to the memory devices over second group of command signal lines having a second number of signal lines to operate at a second data rate, wherein the first number of signal lines is lower than the second number of signal lines, and the first data rate is higher than the second data rate; wherein the logic circuit is to transmit command signals received over the first group of command signal lines to the memory devices over the second group of signal lines.

In one embodiment, the second number of signal lines is double the first number of signal lines and the second data rate is half the first data rate. In one embodiment, the logic circuit further comprising: a multiplexer to receive the first group of command signal lines as input, and selectively output signals from the first group of signal lines to the second group of command signal lines, wherein selection of the multiplexer is controlled by polarity of a clock signal. In one embodiment, the second data rate is single data rate with data bit transfer triggered on either rising or falling edges of a clock signal, and wherein the first data rate is double data rate with data bit transfer triggered on both the rising and falling edges of the clock signal. In one embodiment, the logic circuit is to receive two interleaved command signals on a single command signal line of the first group of command signal lines, and is to output the two command signals on separate command signal lines of the second group of command signal lines. In one embodiment, the memory device comprises a synchronous dynamic random access memory (SDRAM) device compatible with a double data rate (DDR) based standard. In one embodiment, the memory device comprises a synchronous dynamic random access memory (SDRAM) device compatible with a low power double data rate (LPDDR) based standard. In one embodiment, the logic circuit comprises a register. In one embodiment, the logic circuit comprises a buffer. In one embodiment, the DIMM further comprising: a third group of data signal lines to exchange data between the memory controller and the one or more memory devices, wherein the data signal lines are to operate at the first data rate. In one embodiment, further comprising one or more of: the memory controller to manage memory access to the memory devices of the DIMM; at least one processor communicatively coupled to the memory controller and the DIMM; a display communicatively coupled to at least one processor; a battery to power the system; or a network interface communicatively coupled to at least one processor.

In one aspect, a method for operating a memory interface includes: receiving command signals from a memory controller over a first group of command signal lines having a first number of signal lines operated at a first data rate; and transmitting the command signals to memory devices over a second group of command signal lines having a second number of signal lines operated at a second data rate; wherein the first number of signal lines is lower than the second number of signal lines, and the first data rate is higher than the second data rate.

In one embodiment, the second number of signal lines is double the first number of signal lines and the second data rate is half the first data rate. In one embodiment, transmitting the command signal to the memory devices comprises: receiving a command signal line of the first group as an input to a multiplexer; and multiplexing the command signal line of the first group to two command signal lines of the second group. In one embodiment, multiplexing the command signal line of the first group to two command signal lines of the second group comprises, selectively outputting to the two command signal lines of the second group based on polarity of a clock signal. In one embodiment, the second data rate is single data rate with data bit transfer triggered on either rising or falling edges of a clock signal, and wherein the first data rate is double data rate with data bit transfer triggered on both the rising and falling edges of the clock signal. In one embodiment, receiving the command signals from the memory controller comprises receiving two interleaved command signals on a single command signal line of the first group of command signal lines, and wherein transmitting the command signals to the memory devices comprises outputting the two command signals on separate command signal lines of the second group of command signal lines. In one embodiment, the memory device comprises a synchronous dynamic random access memory (SDRAM) device compatible with a double data rate (DDR) based standard. In one embodiment, the memory device comprises a synchronous dynamic random access memory (SDRAM) device compatible with a low power double data rate (LPDDR) based standard. In one embodiment, the receiving and the transmitting comprise receiving at and transmitting from a register of a dual inline memory module (DIMM). In one embodiment, the receiving and the transmitting comprise receiving at and transmitting from a buffer of a dual inline memory module (DIMM).

In one aspect, an apparatus comprising means for performing operations to execute a method for operating a memory interface in accordance with any embodiment of the above aspect of a method. In one aspect, an article of manufacture comprising a computer readable storage medium having content stored thereon, to provide instructions to cause a machine to perform operations to execute a method for operating a memory interface in accordance with any embodiment of the above aspect of a method.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware, software, or a combination. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, data, or a combination. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters or sending signals, or both, to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. Memory device circuitry, comprising:
an input command bus to receive command/address (CA) bits at an input rate;
an output command bus to couple to a group of memory devices, the output command bus wider than the input command bus;
a control logic to map the CA bits from the input command bus to the output command bus based on a polarity of an input clock signal to control the input rate of the CA bits received on the input command bus; and
the control logic to forward the mapped CA bits from the output command bus to a memory device in the group of memory devices based on an output clock signal separate from the input clock signal, the output clock signal to control an output rate of CA bits transmitted on the output command bus, the output rate lower than the input rate.

2. The memory device circuitry of claim 1, wherein:
the input command bus to receive the CA bits on both a rising and a falling edge of the input clock signal; and
to forward the mapped CA bits, the control logic is to transmit the mapped CA bits on either one of a rising and a falling edge of the output clock signal.

3. The memory device circuitry of claim 2, further comprising:
a multiplexor to select the CA bits received on the input command bus according to the polarity of the input clock signal; and
wherein to map the CA bits, the control logic is to buffer selected CA bits to the output command bus.

4. The memory device circuitry of claim 3, wherein to buffer selected CA bits to the output command bus, the control logic is further to:
buffer selected CA bits received at a first polarity to the output command bus to transmit to a first memory address line in a memory device in the group of memory devices;
buffer selected CA bits received at a second polarity to the output command bus to transmit to a second memory address line in a memory device in the group of memory devices, the second memory address line different from the first memory address line, the second polarity opposite to the first polarity; and
wherein the selected CA bits received at the first polarity and the selected CA bits received at the second polarity represent interleaved CA commands.

5. The memory device circuitry of claim 3 wherein, to buffer selected CA bits to the output command bus, the control logic is to buffer to the output command bus two bursts of CA bits received on the input command bus over multiple unit intervals of the input clock signal.

6. The memory device circuitry of claim 5, wherein the two bursts of CA bits represent any of:
interleaved CA commands for different address lines; and
a single CA command for a same address line, the single CA command spanning at least two of the multiple unit intervals of the input clock signal.

7. The memory device circuitry of claim 2, further comprising:
a mode indicator coupled to the control logic to indicate that the input clock signal controlling the input rate is any of a double data rate (DDR) and a single data rate (SDR);
the output rate is a single data rate (SDR); and
the control logic to map and forward the CA bits in accordance with the mode indicator.

8. The memory device circuitry of claim 1, further comprising:
a second input command bus to receive the CA bits at the input rate;
a second output command bus to couple to a second group of memory devices, the second input command bus and second output command bus to operate independent of the respective input command bus and output command bus;
the control logic to map the CA bits received at the input rate on the second input command bus to the second output command bus; and
the control logic to forward, at the output rate lower than the input rate, the mapped CA bits from the second output command bus to a memory device in the second group of memory devices.

9. The memory device circuitry of claim 8 comprising a registering clock driver of a dual inline memory module (DIMM).

10. The memory device circuitry of claim 1, wherein the input rate is a double data rate (DDR) and the output rate is a single data rate (SDR).

11. The memory device circuitry of claim 1, wherein any one or more memory devices in the group of memory devices comprise synchronous dynamic random access memory (SDRAM) devices compliant with a double data rate (DDR) based standard.

12. A computer-implemented method, comprising:
in a memory module including a group of memory devices:

receiving command/address (CA) bits at an input rate over an input command bus;

mapping, based on a polarity of an input clock signal controlling the input rate, the CA bits to an output command bus coupled to the group of memory devices, the output command bus wider than the input command bus;

forwarding mapped CA bits over the output command bus to a memory device in the group of memory devices based on an output clock signal separate from the input clock signal, the output clock signal controlling an output rate of the CA bits transmitted over the output command bus, the output rate lower than the input rate.

13. The computer-implemented method of claim 12, wherein:

receiving the CA bits at the input rate over the input command bus includes receiving the CA bits on both a rising and a falling edge of the input clock signal; and forwarding the mapped CA bits over the output command bus to the memory device includes transmitting the mapped CA bits over the output command bus on either one of a rising and a falling edge of the output clock signal.

14. The computer-implemented method of claim 13, wherein:

the input rate is any of a double data rate (DDR) and a single data rate (SDR); and the output rate is a single data rate (SDR).

15. The computer-implemented method of claim 12, further comprising:

selecting the CA bits received over the input command bus according to the polarity of the input clock signal; and wherein mapping the CA bits includes buffering selected CA bits to the output command bus.

16. The computer-implemented method of claim 15, wherein buffering selected CA bits to the output command bus includes:

buffering selected CA bits received at a first polarity to the output command bus for transmission to a first memory address line in a memory device in the group of memory devices;

buffering selected CA bits received at a second polarity to the output command bus for transmission to a second memory address line in a memory device in the group of memory devices, the second memory address line different from the first memory address line, the second polarity opposite to the first polarity; and wherein the selected CA bits received at the first polarity and the selected CA bits received at the second polarity represent interleaved CA commands.

17. The computer-implemented method of claim 15 wherein buffering selected CA bits to the output command bus includes buffering two bursts of CA bits received over multiple unit intervals of the input clock signal.

18. The computer-implemented method of claim 17, wherein the two bursts of CA bits represent any of:

interleaved CA commands for different address lines; and a single CA command for a same address line, the single CA command spanning at least two of the multiple unit intervals of the input clock signal.

19. The computer-implemented method of claim 12, further comprising:

a second input command bus to receive the CA bits at the input rate;

a second output command bus to couple to a second group of memory devices, the second input command bus and second output command bus to operate independent of the respective input command bus and output command bus;

mapping the CA bits received at the input rate over the second input command bus to the second output command bus; and forwarding, at the output rate different from the input rate, the mapped CA bits over the second output command bus to a memory device in the second group of memory devices.

20. The computer-implemented method of claim 19 performed in a registering clock driver (RCD) of the memory module, including the RCD of a dual inline memory module (DIMM).

21. The computer-implemented method of claim 12, wherein any one or more memory devices in the group of memory devices comprise synchronous dynamic random access memory (SDRAM) devices compliant with a double data rate (DDR) based standard.

22. A computing device comprising:

a dual inline memory module (DIMM) of memory devices and a logic circuit including:

an input hardware interface including a first input command bus and a second input command bus, an input clock signal to control an input rate of command/address (CA) bits received over the first input command bus and the input rate of CA bits received over the second input command bus, an output hardware interface wider than the input hardware interface, including a first output command bus and a second output command bus, and an output clock signal separate from the input clock signal, the output clock signal to control an output rate of CA bits transmitted over the first output command bus and the output rate of CA bits transmitted over the second output command bus, the output rate lower than the input rate;

the logic circuit configured to:

map the CA bits received over the input hardware interface to the output hardware interface based on a polarity of the input clock signal, wherein CA bits received over the first input command bus are mapped to the first output command bus, and CA bits received over the second input command bus are mapped to the second output command bus, forward, for transmission at either one of a rising and falling edge of the output clock signal controlling the output rate, mapped CA bits over the first output command bus to a first memory device in a first group of the memory devices and mapped CA bits over the second output command bus to a second memory device in a second group of the memory devices; and wherein:

the input rate is a double data rate (DDR) and the output rate is a single data rate (SDR), and any one or more of the memory devices comprise synchronous dynamic random access memory (SDRAM) devices compliant with a double data rate (DDR) based standard.

* * * * *